US011332640B2

(12) United States Patent
Taniguchi et al.

(10) Patent No.: US 11,332,640 B2
(45) Date of Patent: May 17, 2022

(54) POLISHING COMPOSITION AND POLISHING METHOD USING SAME

(71) Applicant: FUJIMI INCORPORATED, Kiyosu (JP)

(72) Inventors: Megumi Taniguchi, Kiyosu (JP); Kohsuke Tsuchiya, Kiyosu (JP); Maki Asada, Kiyosu (JP); Taiki Ichitsubo, Kiyosu (JP); Hisanori Tansho, Kiyosu (JP)

(73) Assignee: FUJIMI INCORPORATED, Kiyosu (JP)

( * ) Notice: Subject to any disclaimer, the term of this patent is extended or adjusted under 35 U.S.C. 154(b) by 338 days.

(21) Appl. No.: 16/074,994

(22) PCT Filed: Feb. 8, 2017

(86) PCT No.: PCT/JP2017/004621
§ 371 (c)(1),
(2) Date: Aug. 2, 2018

(87) PCT Pub. No.: WO2017/150118
PCT Pub. Date: Sep. 8, 2017

(65) Prior Publication Data
US 2019/0062595 A1 Feb. 28, 2019

(30) Foreign Application Priority Data

Feb. 29, 2016 (JP) ............................. JP2016-038199
Sep. 30, 2016 (JP) ................................. 2016-193688

(51) Int. Cl.
| | | |
|---|---|---|
| C09G 1/02 | (2006.01) | |
| C09K 3/14 | (2006.01) | |
| B24B 37/04 | (2012.01) | |
| H01L 21/306 | (2006.01) | |
| H01L 21/02 | (2006.01) | |

(52) U.S. Cl.
CPC .............. *C09G 1/02* (2013.01); *B24B 37/044* (2013.01); *C09K 3/1463* (2013.01); *H01L 21/02024* (2013.01); *H01L 21/30625* (2013.01)

(58) Field of Classification Search
CPC ...... C09G 1/02; B24B 37/044; C09K 3/1463; H01L 21/02024; H01L 21/30625
See application file for complete search history.

(56) References Cited

U.S. PATENT DOCUMENTS

| | | | | |
|---|---|---|---|---|
| 2002/0155975 A1* | 10/2002 | Hokkirigawa | ........... | C09G 1/02 510/436 |
| 2005/0205837 A1 | 9/2005 | Miwa | | |
| 2006/0135045 A1* | 6/2006 | Bian | ................. | C09G 1/02 451/36 |
| 2006/0261306 A1* | 11/2006 | Li | ................. | C09K 3/1409 252/79.1 |
| 2007/0176140 A1 | 8/2007 | Matsuda et al. | | |
| 2009/0104778 A1* | 4/2009 | Sakanishi | ............ | C09K 3/1463 438/692 |
| 2009/0197413 A1* | 8/2009 | Shimizu | ................ | C09G 1/02 438/693 |
| 2010/0167547 A1 | 7/2010 | Kamimura | | |
| 2012/0322346 A1 | 12/2012 | Iwano et al. | | |
| 2013/0183826 A1 | 7/2013 | Tsuchiya et al. | | |
| 2015/0290760 A1* | 10/2015 | Serikawa | ............... | B24B 7/22 451/41 |
| 2016/0122591 A1 | 5/2016 | Tsuchiya et al. | | |
| 2017/0081554 A1 | 3/2017 | Tsuchiya et al. | | |
| 2017/0175053 A1 | 6/2017 | Yokota et al. | | |

FOREIGN PATENT DOCUMENTS

| | | |
|---|---|---|
| JP | 2005-123482 A | 5/2005 |
| JP | 2005-268665 A | 9/2005 |
| JP | 2009-218558 A | 9/2009 |
| JP | 2010-095650 A | 4/2010 |
| JP | 2015-007236 A | 1/2015 |
| JP | 2016-009759 A | 1/2016 |
| WO | WO-2012/039390 A1 | 3/2012 |
| WO | WO-2014/196299 A1 | 12/2014 |
| WO | WO-2015/146282 A1 | 10/2015 |

OTHER PUBLICATIONS

Office Action issued in corresponding Taiwanese Patent Application No. 106105752 dated Jul. 7, 2020 with English translation.
Extended European Search Report dated Feb. 13, 2019 in the corresponding European Application No. 17759589.9.
Office Action issued in corresponding Japanese Patent Application No. 2018-502985 dated Jun. 2, 2020 with English translation.
Office Action issued in corresponding Japanese Application No. 2018-502985 dated Oct. 20, 2020 with English translation.

\* cited by examiner

*Primary Examiner* — Pegah Parvini
(74) *Attorney, Agent, or Firm* — Foley & Lardner LLP

(57) ABSTRACT

The present invention relates to a polishing composition containing an abrasive, a water-soluble polymer, an anionic surfactant, a basic compound, and water, in which the anionic surfactant has an oxyalkylene unit, and an average addition mole number of the oxyalkylene unit of the anionic surfactant is more than 3 and 25 or less. According to the present invention, it is possible to provide a polishing composition which can reduce the haze of a polished object and is also excellent in a polishing removal rate.

18 Claims, No Drawings

POLISHING COMPOSITION AND POLISHING METHOD USING SAME

TECHNICAL FIELD

The present invention relates to a polishing composition and a polishing method using the same.

BACKGROUND ART

A metal or semiconductor such as silicon, aluminum, nickel, tungsten, copper, tantalum, titanium, or stainless steel, or an alloy thereof; and a compound semiconductor wafer material such as silicon carbide, gallium nitride, or gallium arsenide are polished with various demands such as flattening, and are practically applied in various fields.

Among them, in order to produce a mirror wafer having a high flatness and high quality mirror surface without scratches and impurities in order to produce a semiconductor device such as an integrated circuit, various studies on technologies for polishing a single-crystalline silicon substrate (silicon wafer) have been made.

In polishing, in order to finish a wafer surface to a high-precision mirror surface, a polishing composition containing abrasives (for example, colloidal particles such as colloidal silica) is used. For example, in JP 2005-268665 A (corresponding to US 2005/205,837 A), a polishing composition containing silicon dioxide such as colloidal silica, an alkali compound, and an anionic surfactant such as a sulfonic acid-based surfactant has been proposed. Further, the above Patent Literature discloses that not only the surface roughness of a silicon wafer after polishing is reduced by the polishing composition, but also the polishing removal rate thereof can be improved by the polishing composition.

Meanwhile, when a silicon wafer surface finished to the mirror surface after polishing is irradiated with intensive light, cloudiness may be seen due to irregular reflection caused by very fine roughness of the silicon wafer surface. This cloudiness is called a haze, and the haze is used as a measure of the roughness of the silicon wafer surface. If there is a haze on the silicon wafer surface, irregular reflection light generated by a haze becomes noise, which may interfere with defect detection by a surface defect tester. Therefore, as the size of a defect to be detected, that is, the size of a defect to be managed becomes smaller, the necessity for improvement of a haze level is increasing.

In response to such a request, for example, in WO 2012/039390 A (corresponding to US 2013/183,826 A), in order to further reduce the haze of a silicon wafer surface, a polishing composition containing water, a basic compound, and a nonionic surfactant containing a polyethylene adduct has been proposed.

SUMMARY OF INVENTION

According to the polishing composition disclosed in JP 2005-268665 A (corresponding to US 2005/205,837 A), the surface roughness of a silicon wafer can be reduced, and the polishing removal rate thereof can be further improved. Further, according to the polishing composition disclosed in WO 2012/039390 A (corresponding to US 2013/183,826 A), the polishing composition contains a specific nonionic surfactant, so that it is possible to reduce the haze of a silicon wafer surface. However, as the required quality of the surface roughness of a silicon wafer is getting higher, a technique capable of further reducing the above-described haze of the silicon wafer surface is required. Further, from the viewpoint of production efficiency, a polishing composition which is also excellent in polishing removal rate is required.

Therefore, in view of the above problems, an object of the present invention is to provide a polishing composition which can reduce the haze of a polished object and is also excellent in polishing removal rate. Another object of the present invention is to provide a polishing method using such a polishing composition.

Solution to Problem

The above problems are solved by a polishing composition containing an abrasive, a water-soluble polymer, an anionic surfactant, a basic compound, and water, in which the anionic surfactant has an oxyalkylene unit, and an average additional mole number of the oxyalkylene unit of the anionic surfactant is more than 3 and 25 or less.

DESCRIPTION OF EMBODIMENTS

Hereinafter, embodiments of the present invention will be described. However, the present invention is not limited to only the following embodiments. Further, unless otherwise noted, operations and measurement of physical properties are performed under conditions of room temperature (in a range of 20° C. or more and 25° C. or less)/relative humidity of 40% to 50% RH.

Hereinafter, a polishing composition of the present invention will be described in detail.

[Polishing Composition]

In an embodiment of the present invention, there is provided a polishing composition containing an abrasive, a water-soluble polymer, an anionic surfactant, a basic compound, and water, wherein the anionic surfactant has an oxyalkylene unit, and an average addition mole number of the oxyalkylene unit of the anionic surfactant is more than 3 and 25 or less. According to the polishing composition of an embodiment of the present invention, a polishing composition that can reduce the haze of a polished object, and also has an excellent polishing removal rate thereof is provided.

The present inventors have conducted intensive studies from the viewpoint of further reducing surface roughness and improving a polishing removal rate. As a result, they have found that an anionic surfactant having an average addition mole number of oxyalkylene units within a specific range and a water-soluble polymer is contained, thereby attaining both further reduction of the surface roughness (haze) of a polished object and a good polishing removal rate thereof.

Although an action mechanism for obtaining the above-described effect by the polishing composition of the present invention is unknown, it is thought as follows. That is, it is thought that the polishing composition according to the present invention contains an anionic surfactant having an average addition mole number of an oxyalkylene unit within a specific range together with a water-soluble polymer, and the water-soluble polymer and the anionic surfactant moderately act on a polishing object, with the result that both reduction of the surface roughness of the polished object and good polishing removal rate thereof can be achieved.

More specifically, when the average addition mole number of the oxyalkylene unit of the anionic surfactant is more than 3, the anionic surfactant protects the surface of the polishing object such as a single-crystalline silicon substrate (hereinafter sometimes referred to as "silicon wafer"), the haze is likely to be reduced. However, when the average addition mole number thereof is 3 or less, the surface protection of the polishing object by adsorption of the anionic surfactant becomes insufficient, and thus the haze level deteriorates.

Further, when the average addition mole number of the oxyalkylene unit of the anionic surfactant is more than 25, the surface protection of the polishing object such as a silicon wafer becomes excessive, and thus it is presumed that the polishing removal rate will be lowered. Therefore, as in the present invention, when the average addition mole number of the oxyalkylene unit is 25 or less, the above-described excessive surface protection is suppressed, and thus a good polishing removal rate can be maintained.

The polishing composition according to the present invention includes a water-soluble polymer in addition to the anionic surfactant. Thus, a water-soluble polymer layer is formed on the surface of the polishing object, so that the haze is considered to be reduced.

The above mechanism is based on presumption, and its true or false matter does not affect the technical scope of the present application.

The polishing composition according to the present invention includes a specific anionic surfactant, a water-soluble polymer, an abrasive, a basic compound, and water. Hereinafter, each component will be described in detail.

<<Anionic Surfactant>>

The polishing composition according to an embodiment of the present invention essentially includes a specific anionic surfactant. Here, the "anionic surfactant" is referred to as a compound having a hydrophobic group and a functional group which is dissociated in water to become anions, and having a surface active action. The anionic surfactant included in the polishing composition according to the present invention has a function of reducing a haze together with the water-soluble polymer. Further, it can be expected that, by the addition of an anionic surfactant, hydrophilicity is imparted to the polished surface after polishing to improve the cleaning efficiency after polishing, to prevent the adhesion of dirt and the like, and to improve the dispersion stability of the polishing composition.

The anionic surfactant included in the polishing composition according to the present invention has an oxyalkylene unit, and the average addition mole number of the oxyalkylene unit is more than 3 and 25 or less. Although the effect that the average addition mole number is within this range is as described above, from the viewpoint of achieving both reduction of a haze and improvement of a polishing removal rate, the lower limit of the average addition mole number of the oxyalkylene unit is preferably 4 or more, and more preferably 4.5 or more. Further, from the same viewpoint, the upper limit of the average addition mole number of the oxyalkylene unit is preferably 20 or less, and more preferably 18 or less.

As described above, from the viewpoint of achieving both reduction of a haze and improvement of a polishing removal rate, the average addition mole number of the oxyalkylene unit is preferably 4 or more and 20 or less, and more preferably 4.5 or more and 18 or less. The "average addition mole number" means an average value of the number of moles of the oxyalkylene group added in 1 mol of the anionic surfactant. When two or more different oxyalkylene units are contained in the anionic surfactant, the average value thereof is adopted. Further, although the average addition mole number of the oxyalkylene unit can be appropriately measured by $^1$H-NMR, gas chromatography (GC), gel permeation chromatography (GPC), gel filtration chromatography (GFC), or a titration method, in the present specification, the average addition mole number is a value measured by the method described in Examples.

Further, the oxyalkylene unit in the anionic surfactant is represented by Chemical Formula "-AO-", and "A" is preferably an alkylene group having 2 or more and 18 or less of carbon atoms. That is, the oxyalkylene unit is preferably an oxyalkylene group having 2 or more and 18 or less of carbon atoms. Here, the alkylene group may be substituted with an aryl group. Examples of such oxyalkylene groups include ethylene oxide group, propylene oxide group, 1,2-butylene oxide group, 2,3-butylene oxide group, and styrene oxide group. Among these, from the viewpoints of easy availability, and being capable of easily reducing of the haze of a polished surface because of easiness of the anionic surfactant to be dispersed in the polishing composition, the oxyalkylene unit is more preferably an oxyalkylene group having 2 or more and 10 or less of carbon atoms, and particularly preferably an oxyalkylene group having 2 or more and 4 or less of carbon atoms. Further, among these, the oxyalkylene unit is preferably an ethylene oxide group and a propylene oxide group, and more preferably an ethylene oxide group.

In some cases, two or more different oxyalkylene units may be present in the anionic surfactant. However, in consideration of easiness of production of a polyoxyalkylene chain and easiness of control of a structure, the oxyalkylene units are preferably the same repeating units.

The kind of the anionic surfactant is not particularly limited as long as the average addition mole number of the oxyalkylene unit is within the above range. However, preferably, the anionic surfactant is selected from the group consisting of a sulfuric ester (R—O—SO$_3^-$H$^+$) and a salt thereof (R—O—SO$_3^-$M$^+$), a sulfonic acid (R—SO$_3^-$H$^+$) and a salt thereof (R—SO$_3^-$M$^+$), a carboxylic acid (R—COO—H$^+$) and a salt thereof (R—COO-M$^+$), and a phosphoric ester (R—O—PO(O$^-$H$^+$)$_2$) and a salt thereof (R—O—PO(O$^-$H$^+$) (O$^-$M$^+$) or R—O—PO(O$^-$M$^+$)$_2$). In the above, "R" represents an organic group containing the aforementioned oxyalkylene unit (-AO- or -OA-: provided that the average addition mole number is more than 3 and 25 or less). Further, in the above, "M$^+$" represents various cations such as a metal cation and an ammonium cation. From the viewpoint of easily reducing a haze, the anionic surfactant is preferably selected from the group consisting of a sulfuric ester and a salt thereof, a carboxylic acid and a salt thereof, and a phosphoric ester and a salt thereof, and more preferably selected from the group consisting of a sulfuric ester and a salt thereof and a carboxylic acid and a salt thereof. Here, from the viewpoint of more effectively reducing the haze, the carboxylic acid and the salt thereof are preferably acetic acid (R—CH$_2$COO$^-$H$^+$) and a salt thereof (R—CH$_2$COO$^-$M$^+$). Therefore, from the viewpoint of further improving the haze reducing effect, the anionic surfactant is particularly preferably a sulfuric ester and a salt thereof, and an acetic acid and a salt thereof.

When the above-described salt is classified by the above "M$^+$", examples of the kind of the salt include alkali metal salts such as sodium and potassium, salts of Group 2 elements such as calcium and magnesium, ammonium salts, and alkanolamine salts such as triethanolamine.

Further, in one molecule of the anionic surfactant, two or more kinds of the above anion moieties (that is, "—O—SO$_3^-$" moiety, "—SO$_3^-$" moiety, "—COO$^-$" moiety, "—O—PO(OH)O$^-$" moiety, and "—O—PO(O$^-$)$_2$" moiety) may be included.

The sulfuric ester and the salt thereof used as the anionic surfactant in the present invention is not particularly limited, but examples thereof include polyoxyethylene lauryl ether sulfate, polyoxyethylene myristyl ether sulfate, and polyoxyethylene palmityl ether sulfate; and sodium polyoxyethylene lauryl ether sulfate, ammonium polyoxyethylene lauryl ether sulfate, triethanolamine polyoxyethylene lauryl ether sulfate, sodium polyoxyethylene myristyl ether sulfate, ammonium polyoxyethylene myristyl ether sulfate, triethanolamine polyoxyethylene myristyl ether sulfate, sodium polyoxyethylene palmityl ether sulfate, amine polyoxyethylene palmityl ether sulfate, and triethanolamine polyoxyethylene palmityl ether sulfate. Among these, sodium polyoxyethylene lauryl ether sulfate and ammonium polyoxyethylene lauryl ether sulfate are preferable.

The sulfonic acid and the salt thereof used as the anionic surfactant in the present invention is not particularly limited, but examples thereof include polyoxyethylene octyl sulfonic acid, polyoxyethylene lauryl sulfonic acid, polyoxyethylene palmityl sulfonic acid, polyoxyethylene octyl benzene sulfonic acid, and polyoxyethylene lauryl benzene sulfonic acid; and sodium polyoxyethylene octyl sulfonate, sodium polyoxyethylene lauryl sulfonate, and sodium polyoxyethylene palmityl sulfonate. Among these, polyoxyethylene octyl sulfonic acid and sodium polyoxyethylene octyl sulfonate are preferable.

The carboxylic acid and the salt thereof (acetic acid and salt thereof) used as the anionic surfactant in the present invention is not particularly limited, but examples thereof include polyoxyethylene lauryl ether acetic acid, polyoxyethylene tridecyl ether acetic acid, and polyoxyethylene octyl ether acetic acid; and sodium polyoxyethylene lauryl ether acetate, ammonium polyoxyethylene lauryl ether acetate, sodium polyoxyethylene tridecyl ether acetate, ammonium polyoxyethylene tridecyl ether acetate, sodium polyoxyethylene octyl ether acetate, and ammonium polyoxyethylene octyl ether acetate. Among these, sodium polyoxyethylene lauryl ether acetate and ammonium polyoxyethylene lauryl ether acetate are preferable.

The phosphoric ester and the salt thereof used as the anionic surfactant in the present invention is not particularly limited, but examples thereof include polyoxyethylene lauryl ether phosphate and polyoxyethylene alkyl (12-15) ether phosphate; sodium polyoxyethylene lauryl ether phosphate, sodium polyoxyethylene oleyl ether phosphate, sodium polyoxyethylene palmityl ether phosphate, and potassium polyoxyethylene alkyl (12-15) ether phosphate. Among these, polyoxyethylene alkyl (12-15) ether phosphate and sodium polyoxyethylene lauryl ether phosphate are preferable.

Further, as the anionic surfactant including two or more kinds of the anion moieties in one molecule, polyoxyethylene lauryl sulfosuccinate disodium salt and polyoxyethylene lauroyl ethanolamide sulfosuccinate disodium salt are exemplified.

The structure of a ω-position terminal hydrophobic group in the anionic surfactant of the present invention is not particularly limited, but, for example, may be substituted with a substituted or unsubstituted alkyl group of C2 to C30, a substituted or unsubstituted cycloalkyl group of C3 to C20, a substituted or unsubstituted alkyl ester group of C1 to C30, a substituted or unsubstituted aryl group of C6 to C20, a mono- or dialkylamide group having an alkyl group of C1 to C30, or a mono- or dialkylamino group having an alkyl group of C1 to C30, and may also have a sorbitan structure.

Examples of the alkyl group include ethyl group, n-propyl group, isopropyl group, n-butyl group, isobutyl group, sec-butyl group, tert-butyl group, n-pentyl group, isopentyl group, neopentyl group, 1,2-dimethylpropyl group, n-hexyl group, n-heptyl group, n-octyl group, 2-ethylhexyl group, n-decyl group, and n-dodecyl group.

Examples of the cycloalkyl group include cyclopentyl group and cyclohexyl group.

Examples of the alkyl ester group include methyl ester group, ethyl ester group, n-propyl ester group, i-propyl ester group, n-butyl ester group, and 2-methyl propyl ester group.

Examples of the aryl ester group include phenyl group, and o-, m- or p-tolyl group.

In the present specification, the expression "substituted or unsubstituted" means that the hydrogen atom in the corresponding substituent is substituted with a substituent such as a fluorine atom; a chlorine atom; a bromine atom; a cyano group; a nitro group; a hydroxy group; a linear or branched alkyl group of C1 to C10; a linear or branched alkoxy group of C1 to C10; an aryl group of C6 to C30; a heteroaryl group of C2 to C30; or a cycloalkyl group of C5 to C20, or is not substituted.

The above anionic surfactant may be used alone, and may also be used as a combination of two or more.

In the above-exemplified anionic surfactant, the average addition mole number of an ethylene oxide unit is more than 3 and 25 or less. From the viewpoint of achieving both reduction of a haze and improvement of a polishing removal rate, the lower limit of the average addition mole number of the ethylene oxide unit is preferably 4 or more, and more preferably 4.5 or more. Further, from the same viewpoint, the upper limit of the average addition mole number of the ethylene oxide unit is preferably 20 or less, and more preferably 18 or less.

As described above, further, from the viewpoint of achieving both reduction of a haze and improvement of a polishing removal rate, the average addition mole number of the ethylene oxide unit is preferably 4 or more and 20 or less, and more preferably 4.5 or more and 18 or less.

From the viewpoint of reducing a haze and improving a polishing removal rate, the weight average molecular weight of the anionic surfactant is preferably 5,000 or less, more preferably 4,000 or less, and further preferably 3,000 or less, in terms of polyethylene oxide. Further, the weight average molecular weight of the anionic surfactant is preferably 200 or more, more preferably 300 or more, and further preferably 400 or more. The weight average molecular weight of the anionic surfactant can be measured by, for example, gel permeation chromatography (GPC).

Here, the surface of a single-crystalline silicon substrate (silicon wafer), which is a preferable polishing object, is generally finished to a high-quality mirror surface through a lapping step (rough polishing step) and a polishing step (fine polishing step). The polishing step is usually constituted by a plurality of polishing steps including a stock polishing step and a final polishing step. For example, in the step of roughly polishing a silicon wafer (for example, a stock polishing step), a polishing composition having a high removal ability (polishing ability) tends to be used, and in the step of finely polishing the silicon wafer (for example, a final polishing step), a polishing composition having a low polishing ability tends to be used. As described above, since the required polishing characteristics of a polishing composition to be used for each polishing step are different, the content of the anionic surfactant contained in the polishing composition depends on the stage of the polishing step in which the polishing composition is used, and thus different content of the anionic surfactant can be adopted.

Although the content of the anionic surfactant in the polishing composition used in the stock polishing step (total amount in the case where two or more kinds thereof are used) is not particularly limited, from the viewpoint of improving a haze reduction effect, the content of the anionic surfactant is preferably $1 \times 10^{-7}$% by mass or more, more preferably $1 \times 10^{-6}$% by mass or more, and particularly preferably $5 \times 10^{-5}$% by mass or more, relative to the total mass of the polishing composition. Meanwhile, from the viewpoint of improving a polishing removal rate, the content thereof is preferably 0.5% by mass or less, more preferably 0.05% by mass or less, and particularly preferably 0.005% by mass or less, relative to the total mass of the polishing composition used in the stock polishing step.

Although the content of the anionic surfactant in the polishing composition used in the final polishing step (total amount in the case where two or more kinds thereof are used) is not particularly limited, from the viewpoint of improving a haze reduction effect, the content of the anionic surfactant is preferably $1 \times 10^{-6}$% by mass or more, more preferably $5 \times 10^{-5}$% by mass or more, and particularly preferably $1 \times 10^{-4}$% by mass or more, relative to the total mass of the polishing composition. Meanwhile, from the viewpoint of improving a polishing removal rate, the content thereof is preferably 1% by mass or less, more preferably 0.1% by mass or less, and particularly preferably 0.01% by mass or less, relative to the total mass of the polishing composition used in the final polishing step.

<<Water-Soluble Polymer>>

The polishing composition according to an embodiment of the present invention essentially contains a water-soluble polymer. Since the water-soluble polymer forms a water-soluble polymer layer on the surface of a polishing object, a haze can be reduced. Further, the water-soluble polymer has a function of reducing the haze of the polished object together with the anionic surfactant. In the present specification, the "water-soluble polymer" refers to a polymer having a solubility of 0.01 g/100 mL or more in water (25° C.). Further, the "polymer" refers to one having a weight average molecular weight of 5,000 or more. The weight average molecular weight can be measured by gel permeation chromatography (GPC), and in more detail, the value measured by the method described in the examples is adopted.

As the water-soluble polymer, a water-soluble polymer having at least one functional group selected from a cationic group, an anionic group, and a nonionic group in a molecule can be used. Specific examples of the water-soluble polymer include those containing a hydroxyl group, a carboxyl group, an acyloxy group, a sulfo group, a quaternary ammonium structure, a heterocyclic structure, a vinyl structure, or a polyoxyalkylene structure in a molecule. From the viewpoint of reduction of aggregates and improvement of cleanability, a nonionic water-soluble polymer can be preferably adopted. Preferable examples thereof include polymers containing oxyalkylene units, polymers containing nitrogen atoms (nitrogen-containing water-soluble polymers), polyvinyl alcohol, polymers containing a constituent unit derived from vinyl alcohol, cellulose derivatives, and starch derivatives.

More preferably, the water-soluble polymer is at least one selected from a polymer having an oxyalkylene unit, a polymer having a nitrogen atom, polyvinyl alcohol, a polymer having a constituent unit derived from vinyl alcohol, and a cellulose derivative. Further preferably, the water-soluble polymer is selected from a polymer having a nitrogen atom, a polymer having a constituent unit derived from vinyl alcohol, and a cellulose derivative.

As the polymer having an oxyalkylene unit, polyethylene oxide (PEO), a block copolymer of ethylene oxide (EO) and propylene oxide (PO) and a random copolymer of EO and PO are exemplified. The block copolymer of EO and PO may be a diblock structure, a triblock structure, or the like including a polyethylene oxide (PEO) block and a polypropylene oxide (PPO) block. The triblock structure includes a PEO-PPO-PEO type triblock and a PPO-PEO-PPO type triblock. Generally, the PEO-PPO-PEO type triblock is more preferable. In the block copolymer or random copolymer of EO and PO, the molar ratio (EO/PO) of EO and PO constituting the corresponding copolymer, from the viewpoint of solubility in water and cleanability, is preferably more than 1, more preferably 2 or more, and particularly preferably 3 or more (for example, 5 or more).

The polymer having a nitrogen atom is not particularly limited as long as it has one or more nitrogen atoms in a monomer unit or has one or more nitrogen atoms in a part of a side chain. For example, an amine, an imine, an amide, an imide, a carbodiimide, a hydrazide, a urethane compound and the like can be used. The polymer having a nitrogen atom may be a linear, cyclic, primary, secondary or tertiary. Further, the polymer may be a nitrogen-containing water-soluble polymer having a salt structure in which a nitrogen atom forms a cation. Further, any of a polymer having a nitrogen atom in a main chain and a polymer having a nitrogen atom in a side chain functional group (pendant group) can be used. As the nitrogen-containing water-soluble polymer having a salt structure, for example, a quaternary ammonium salt is exemplified. Examples of the nitrogen-containing water-soluble polymer include polycondensation-type polyamide such as water-soluble nylon, polycondensation-type polyester such as water-soluble polyester, polyaddition-type polyamine, polyaddition-type polyimine, polyaddition-type (meth)acrylamide, a water-soluble polymer having a nitrogen atom in at least a part of the alkyl main chain, and a water-soluble polymer having a nitrogen atom in at least a part of the side chain. The water-soluble polymer having a nitrogen atom in the side chain also includes a water-soluble polymer having a quaternary nitrogen in the side chain. Specific examples of the polyaddition-type nitrogen-containing water-soluble polymer include polyvinyl imidazole, polyvinyl carbazole, polyvinyl pyrrolidone, poly N-vinyl formamide, polyvinyl caprolactam, and polyvinyl piperidine. Further, the nitrogen-containing water-soluble polymer may partially have a structure having hydrophilicity such as a methacrylic acid structure, a vinylsulfonic acid structure, or an oxyalkylene structure. Further, the nitrogen-containing water-soluble polymer may be a polymer having a plurality of kinds of structures such as a diblock structure, a triblock structure, a random structure, and an alternating structure. The nitrogen-containing water-soluble polymer may be any one of a polymer having a cation in a part or whole of the molecule, a polymer having an anion in a part or whole of the molecule, a polymer having both a cation and an anion in a part or whole of the molecule, and a polymer having a nonion in a part or whole of the molecule. Examples of the polymer having a nitrogen atom in the main chain include homopolymers and copolymers of N-acylalkyleneimine type monomers. Specific examples of the N-acylalkyleneimine type monomers include N-acetylethyleneimine and N-propionylethyleneimine. Examples of the polymer having a nitrogen atom in a pendant group include homopolymers and copolymers of N-(meth)acryloyl type monomers, homopolymers and copolymers of N-alkoxyalkyl (meth)acrylamide type monomers, homopolymers and copolymers of N-hydroxyalkyl (meth) acrylamide type monomers, homopolymers and copolymers of N-alkyl (meth)acrylamide type monomers, homopolymers and copolymers of N-dialkyl (meth)acrylamide type monomers, and homopolymers and copolymers of N-vinyl type monomers. Here, the term "(meth)acryloyl" means to comprehensively refer to acrylic and methacrylic. Specific examples of N-(meth)acryloyl type monomers include N-(meth)acryloyl morpholine and N-(meth)acryloyl piperidine. Specific examples of N-alkoxyalkyl (meth)acrylamide type monomers include N-methoxymethyl (meth)acrylamide, N-ethoxymethyl (meth)acrylamide, and N-butoxymethyl (meth)acrylamide. Specific examples of N-hydroxyalkyl (meth)acrylamide type monomers include N-(2-hydroxyethyl) (meth)acrylamide and N-(1,1-dimethyl-2-hydroxyethyl) (meth)acrylamide. Specific examples of N-alkyl (meth)acrylamide type monomers include N-methyl (meth)acrylamide, N-ethyl (meth)acrylamide, N-propyl (meth)acrylamide, and N-isopropyl (meth)acrylamide. Specific examples of N-dialkyl (meth)acrylamide type monomers include N,N-dimethyl (meth)acrylamide, N,N-diethyl (meth)acrylamide, and N,N-dipropyl (meth)acrylamide. Specific examples of N-vinyl type monomers include N-vinyl pyrrolidone. In the present specification, unless otherwise specified, the "copolymer" means to comprehensively refer to various kinds of copolymers, such as random copolymers, alternating copolymers, block copolymers, and graft copolymers.

Polyvinyl alcohol is obtained by saponifying polyvinyl acetate. At this time, saponification degree is not particularly limited.

The polymer having a constituent unit derived from vinyl alcohol is a copolymer having a vinyl alcohol unit (structural moiety represented by —$CH_2$—CH(OH)—; hereinafter referred to as a "VA unit".) and a non-vinyl alcohol unit (a constituent unit derived from a monomer other than vinyl alcohol; hereinafter, referred to as a "non-VA unit".) in a molecule. That is, the polymer is a copolymer in which a part of one molecule is composed of a VA unit and the other part is composed of a non-VA unit. The non-VA unit is not particularly limited, and examples thereof include a constituent unit derived from vinyl pyrrolidone, a constituent unit derived from ethylene, an alkyl vinyl ether unit, and a constituent unit obtained by acetalizing a polyvinyl alcohol and an aldehyde.

Among these, preferably, the non-VA unit is selected from the group consisting of a vinyl ether unit (alkyl vinyl ether unit) having an alkyl group having 1 or more and 10 or less carbon atoms, a vinyl ester unit (monocarboxylic acid vinyl ester unit) derived from a monocarboxylic acid having 1 or more and 7 or less carbon atoms, and a constituent unit obtained by acetalizing a polyvinyl alcohol and an aldehyde having an alkyl group having 1 or more and 7 or less carbon atoms.

Examples of the vinyl ether unit having an alkyl group having 1 or more and 10 or less carbon atoms include a propyl vinyl ether unit, a butyl vinyl ether unit, and 2-ethylhexyl vinyl ether unit. Example of the vinyl ester unit derived from a monocarboxylic acid having 1 or more and 7 or less carbon atoms include a vinyl propanoate unit, a vinyl butanoate unit, a vinyl pentanoate unit, and a vinyl hexanoate unit.

The polymer having a constituent unit derived from vinyl alcohol may contain only one kind of non-VA unit, or may also contain two or more kinds of non-VA units. The content ratio (molar ratio) of the VA unit and the non-VA unit is not particularly limited. For example, the content ratio (molar ratio) of VA unit:non-VA unit is preferably 99:1 to 1:99, more preferably 95:5 to 50:50, and particularly preferably 95:5 to 80:20.

Examples of the polymer having a constituent unit derived from vinyl alcohol include a copolymer having a vinyl alcohol unit and a vinyl pyrrolidone unit, a copolymer having a vinyl alcohol unit and an ethylene unit, a copolymer having a vinyl alcohol unit and a methyl vinyl ether unit, a copolymer having a vinyl alcohol unit and an n-propyl vinyl ether unit, a copolymer having a vinyl alcohol unit and an i-propyl vinyl ether unit, a copolymer having a vinyl alcohol unit and an n-butyl vinyl ether unit, a copolymer having a vinyl alcohol unit and an i-butyl vinyl ether unit, a copolymer having a vinyl alcohol unit and a t-butyl vinyl ether unit, a copolymer having a vinyl alcohol unit and a 2-ethylhexyl vinyl ether unit, and a polymer obtained by acetalizing a part of a polyvinyl alcohol unit with n-butyl aldehyde.

The above polymer having constituent units derived from polyvinyl alcohol and vinyl alcohol (copolymer having a VA unit and a non-VA unit) may be a modified polyvinyl alcohol having a hydrophilic functional group at its side chain. Examples of this functional group include an oxyalkylene group, a carboxyl group, a sulfo group, an amino group, a hydroxyl group, an amide group, an imide group, a nitrile group, an ether group, an ester group, and salts thereof.

As the modified polyvinyl alcohol, for example, cationized polyvinyl alcohol having a cationic group such as quaternary ammonium structure may be used. Examples of the cationized polyvinyl alcohol include those derived from monomers having a cationic group such as a diallyl dialkylammonium salt or an N-(meth)acryloylaminoalkyl-N,N,N-trialkyl ammonium salt.

The "cellulose derivative" refers to one in which some of hydroxyl groups of cellulose are substituted with other different substituents. Examples of the cellulose derivative include cellulose derivatives such as hydroxyethyl cellulose, hydroxypropyl cellulose, hydroxyethyl methyl cellulose, hydroxypropyl methyl cellulose, methyl cellulose, ethyl cellulose, ethyl hydroxyethyl cellulose, and carboxymethyl cellulose; and pullulan.

Examples of starch derivatives include pregelatinized starch, pullulan, and cyclodextrin. Among these, pullulan is preferable.

The water-soluble polymer may be used alone, and may also be used as a combination of two or more.

Among the above water-soluble polymers, from the viewpoint of easily reducing the haze of a polished object, preferably, the water-soluble polymer contains at least one selected from a polymer having a nitrogen atom, a cellulose derivative, and a polymer having a constituent unit derived from vinyl alcohol. When the above compound is used as a water-soluble polymer, a water-soluble polymer layer is more easily formed on the surface of a polishing object (particularly, a silicon wafer), and thus a haze reduction effect is further improved, compared to the case when other water-soluble polymers are used. From such a viewpoint, it is particularly preferable that the water-soluble polymer contains a cellulose derivative. Furthermore, among cellulose derivatives, from the viewpoint that a water-soluble polymer film is easily formed on the surface of the polishing object and the haze reducing effect is high, hydroxyethyl cellulose is particularly preferable.

From the viewpoint of improving a polishing removal rate and reducing a haze, the weight average molecular weight of the water-soluble polymer is preferably 2,000,000 or less, more preferably 1,000,000 or less, further preferably 500,000 or less, and most preferably 300,000 or less, in terms of polyethylene oxide. Further, the weight average molecular weight of the water-soluble polymer in the polishing composition is preferably 10,000 or more, more preferably 20,000 or more, and further preferably 30,000 or more. When the weight average molecular weight is within the above range, it is preferable from the viewpoint of the dispersion stability of the polishing composition and the cleanability of a silicon wafer when a polishing object is a single-crystalline silicon substrate (silicon wafer). The weight average molecular weight of the water-soluble polymer can be measured by gel permeation chromatography (GPC), and in more detail, the value measured by the method described in the examples is adopted.

In terms of the content of the water-soluble polymer contained in the polishing composition, depending on the stage of the polishing step in which the polishing composition is used, different content of the water-soluble polymer can be adopted.

According to an increase in the content of the water-soluble polymer, the formation of a water-soluble polymer layer is promoted on the surface of a polishing object, and a haze can be reduced. In contrast, according to a decrease in the content of the water-soluble polymer, a polishing removal rate is improved.

The content of the water-soluble polymer in the polishing composition used in the stock polishing step (total amount in the case where two or more kinds thereof are used), from the viewpoint of improving the wettability of a polished surface and further reducing a haze, is preferably $1 \times 10^{-6}$% by mass or more, more preferably $5 \times 10^{-5}$% by mass or more, and further preferably $1 \times 10^{-4}$% by mass or more. Meanwhile, from the viewpoint of improving a polishing removal rate, the content thereof is preferably 1% by mass or less, more preferably 0.1% by mass or less, and further preferably 0.02% by mass or less.

The content of the water-soluble polymer in the polishing composition used in the final polishing step (total amount in the case where two or more kinds thereof are used), from the viewpoint of improving the wettability of a polishing surface and further reducing a haze, is preferably $1 \times 10^{-4}$% by mass or more, more preferably $1 \times 10^{-3}$% by mass or more, further preferably $2 \times 10^{-3}$% by mass or more, further preferably $3 \times 10^{-3}$% by mass or more, and particularly preferably $5 \times 10^{-3}$% by mass or more. Meanwhile, from the viewpoint of improving a polishing removal rate, the content thereof is preferably 1% by mass or less, more preferably 0.1% by mass or less, and further preferably 0.02% by mass or less.

Among the above, particularly, when a cellulose derivative (for example, hydroxyethyl cellulose) is used as the water-soluble polymer in the polishing composition, it may be used in combination with polyvinyl pyrrolidone.

<<Abrasive (Abrasive Grain)>>

The polishing composition according to an embodiment of the present invention essentially contains an abrasive (abrasive grain). The abrasive serves to mechanically polish the surface of a polishing object.

The material and properties of the abrasives are not particularly limited, and can be appropriately selected depending on the use purpose and use mode of the polishing composition. Examples of the abrasive include inorganic particles, organic particles, and organic-inorganic composite particles. Specific examples of the inorganic particles include oxide particles such as silica particles, alumina particles, cerium oxide particles, chromium oxide particles, titanium dioxide particles, zirconium oxide particles, magnesium oxide particles, manganese dioxide particles, zinc oxide particles, and Bengala particles; nitride particles such as silicon nitride particles and boron nitride particles; carbide particles such as silicon carbide particles and boron carbide particles; diamond particles; and carbonates such as calcium carbonate and barium carbonate. Specific examples of the organic particles include polymethyl methacrylate (PMMA) particles and poly(meth)acrylic acid particles (here, (meth)acrylic acid means to comprehensively refer to acrylic acid and methacrylic acid.), and polyacrylonitrile particles. The abrasives may be used alone, and may also be used as a combination of two or more.

As the abrasive, inorganic particles are preferable, and among them, particles made of oxides of metals or metalloids are preferable. Particularly preferably the abrasive includes silica particles. Examples of the silica particles include colloidal silica, fumed silica, and precipitated silica.

Among the silica particles, colloidal silica and fumed silica are preferable, and colloidal silica is particularly preferable. When colloidal silica or fumed silica is used, particularly, when colloidal silica is used, scratches generated on the surface of a silicon wafer in the polishing step are reduced.

In terms of the content and particle size of the abrasive contained in the polishing composition, depending on the stage of the polishing step in which the polishing composition is used, different content and different particle size of those can be adopted.

As the content of the abrasive increases, the polishing removal rate for the surface of a polishing object improves. Meanwhile, as the content of the abrasive decreases, the dispersion stability of the polishing composition tends to be improved, and the residue of the abrasive on the polished surface tends to be reduced.

The content of the abrasive in the polishing composition used in the stock polishing step is not particularly limited, but is preferably 0.001% by mass or more, more preferably 0.01% by mass or more, further preferably 0.1% by mass or more, and particularly preferably 0.2% by mass or more. Further, the content of the abrasive in the polishing composition used in the stock polishing step is preferably 10% by mass or less, more preferably 5% by mass or less, further preferably 1% by mass or less, and most preferably 0.8% by mass or less.

The content of the abrasive in the polishing composition used in the final polishing step is not particularly limited, but is preferably 0.001% by mass or more, more preferably 0.01% by mass or more, further preferably 0.05% by mass or more, and particularly preferably 0.1% by mass or more. Further, the content of the abrasives in the polishing composition used in the final polishing step is preferably 10% by mass or less, more preferably 5% by mass or less, further preferably 1% by mass or less, and most preferably 0.5% by mass or less.

Further, as the particle size of the abrasive increases, the surface of a polishing object is easily mechanically polished, and the polishing removal rate is improved. Meanwhile, as the particle size of the abrasive decreases, the haze is easy to reduce.

The average primary particle diameter of the abrasive used in the stock polishing step is not particularly limited, but is preferably 5 nm or more, more preferably 10 nm or more, further preferably 20 nm or more, and further more preferably 30 nm or more. Further, the average primary particle diameter of the abrasive used in the stock polishing step is preferably 100 nm or less, more preferably 80 nm or less, and further preferably 60 nm or less.

The average primary particle diameter of the abrasive in the polishing composition used in the final polishing step is not particularly limited, but is preferably 5 nm or more, more preferably 10 nm or more, and further preferably 20 nm or more. Further, the average primary particle diameter of the abrasive in the polishing composition used in the final polishing step is preferably 60 nm or less, more preferably 50 nm or less, and further preferably 40 nm or less.

Further, the average secondary particle diameter of the abrasive in the polishing composition used in the stock polishing step is not particularly limited, but is preferably 10 nm or more, more preferably 20 nm or more, and further preferably 40 nm or more. Further, the average primary particle diameter of the abrasives in the polishing composition used in the stock polishing step is preferably 250 nm or less, more preferably 180 nm or less, and further preferably 150 nm or less.

Further, the average secondary particle diameter of the abrasive in the polishing composition used in the final polishing step is not particularly limited, but is preferably 20 nm or more, and more preferably 40 nm or more. Further, the average secondary particle diameter of the abrasive in the polishing composition used in the final polishing step is preferably 100 nm or less, more preferably 90 nm or less, and further preferably 80 nm or less.

The value of the average primary particle diameter of the abrasive is calculated from, for example, a specific surface area measured by a BET method. The specific surface area of the abrasive can be measured using the "Flow Sorb II 2300" manufactured by Micromeritics Instrument Corporation. Further, the average secondary particle diameter of the abrasive is measured by, for example, a dynamic light scattering method, and, for example, can be measured using the "NANOTRAC (registered trademark) UPA-UT 151" manufactured by NIKKISO CO., LTD.

<<Basic Compound>>

The polishing composition according to an embodiment of the present invention essentially contains a basic compound. Here, the basic compound refers to a compound having a function of increasing the pH of the polishing composition by being added to the corresponding composition. The basic compound has a function of chemically polishing the surface of a polishing object by etching and has a function of improving the dispersion stability of abrasives. Further, the basic compound can be used as a pH adjusting agent.

Specific examples of the basic compound include hydroxides or salts of Group 2 elements or alkali metals, quaternary ammonium compounds, ammonia or salts thereof, and amines.

In the hydroxides or salts of Group 2 elements or alkali metals, the Group 2 elements are not particularly limited, but alkaline earth metals are preferably used, and examples thereof include calcium and the like. Examples of the alkali metals include potassium and sodium. Examples of the salts include carbonate, hydrocarbonate, sulfate, and acetate. Examples of the hydroxides or salts of Group 2 elements or alkali metals include calcium hydroxide, potassium hydroxide, potassium carbonate, potassium hydrogen carbonate, potassium sulfate, potassium acetate, potassium chloride, sodium hydroxide, sodium hydrogen carbonate, and sodium carbonate.

Examples of the quaternary ammonium compounds include salts such as hydroxide, chloride, carbonate, hydrocarbonate, sulfate, and phosphate of tetramethylammonium, tetraethylammonium, and tetrabutylammonium. Specific examples thereof include tetraalkylammonium hydroxide such as tetramethylammonium hydroxide, tetraethylammonium hydroxide, and tetrabutylammonium hydroxide; tetraalkylammonium carbonate such as tetramethylammonium carbonate, tetraethylammonium carbonate, and tetrabutylammonium carbonate; and tetraalkylammonium chloride such as tetramethylammonium chloride, tetraethylammonium chloride, and tetrabutylammonium chloride.

Examples of other ammonium salts include ammonium carbonate and ammonium hydrogen carbonate.

Specific examples of amines include methylamine, dimethylamine, trimethylamine, ethylamine, diethylamine, triethylamine, ethylenediamine, monoethanolamine, N-(β-aminoethyl)ethanolamine, hexamethylenediamine, diethylenetriamine, triethylenetetramine, piperazine anhydride, piperazine hexahydrate, 1-(2-aminoethyl) piperazine, N-methylpiperazine, and guanidine.

Here, a preferable compound can be selected depending on the expected function of the basic compound.

Here, as the basic compound in the polishing composition used in the stock polishing step, from the viewpoint of improving a polishing removal rate, it is preferable to use a quaternary ammonium hydroxide compound such as tetramethyl ammonium hydroxide. Further, from the viewpoint of improving a polishing removal rate, the basic compound in the polishing composition used in the stock polishing step preferably include carbonate or hydrocarbonate, and more preferably, potassium carbonate, potassium hydrogen carbonate, ammonium carbonate, ammonium hydrogen carbonate, sodium carbonate, or sodium hydrogen carbonate. Further, when a mixture of a quaternary ammonium hydroxide compound and carbonate or hydrogen carbonate is used as the basic compound, it is preferable from the viewpoint that the polishing composition has a buffering action and maintains the pH stability for each polishing step.

Further, as the basic compound in the polishing composition used in the final polishing step, a compound not containing alkaline earth metal, alkali metal, and transition metal is preferably used, from the viewpoint that the basic compound does not remain on a polished object. Therefore, as the basic compound, for example, quaternary ammonium hydroxide, amine, and ammonia are preferable, and from the viewpoint of ease of treatment, quaternary ammonium hydroxide and ammonia are further preferable, and ammonia is most preferable.

The content of the basic compound in the polishing composition (total amount in the case where two or more kinds thereof are used) is preferably 0.001% by mass or more, and more preferably 0.003% by mass or more. As the content of the basic compound increases, it is easier to obtain a high polishing removal rate. Meanwhile, the content of the basic compound in the polishing composition (total amount in the case where two or more kinds thereof are used) is preferably 0.2% by mass or less, and more preferably 0.1% by mass or less. As the content of the basic compound decreases, it is easier to reduce a haze.

As the process comes closer to the final polishing step, it is preferable to reduce the content of the basic compound in steps. Illustratively, the content of the basic compound in the stock polishing composition is the largest, and is preferably in the range of 2 to 20 times the content of the basic compound in the final polishing composition.

<<Water>>

The polishing composition according to one embodiment of the present invention essentially contains water. Water functions as a solvent for dissolving other components or as a dispersing medium for dispersing other components.

From the viewpoint of inhibiting the contamination of a polishing object and the action of other components, water not containing impurities as much as possible is preferable. For example, water having a total content of transition metal ions of 100 ppb or less is preferable. Here, the purity of water can be increased by operations such as removal of impurity ions using an ion exchange resin, removal of contaminants by a filter, distillation, and the like. Specifically, for example, it is preferable to use ion exchange water (deionized water), pure water, ultrapure water, distilled water, or the like as water.

<<Other Components>>

The polishing composition according to an embodiment of the present invention may contain other components, if necessary, in addition to the abrasive, the water-soluble polymer, the anionic surfactant, the basic compound, and water. However, meanwhile, preferably, the polishing composition according to the present invention does not substantially contain an oxidant. When an oxidant is contained in the polishing composition, the surface of a polishing object (for example, a silicon wafer) is oxidized to form an oxide layer by supplying the composition to the polishing object, so that a polishing removal rate may decrease. Here, specific examples of the oxidant include hydrogen peroxide ($H_2O_2$), sodium persulfate, ammonium persulfate, and sodium dichloroisocyanurate. The fact that the polishing composition does not substantially contain the oxidant means that at least an oxidant is not intentionally contained in the polishing composition. Therefore, the polishing composition inevitably containing a trace amount of an oxidant (for example, the molar concentration of the oxidant in the polishing composition is 0.0005 mol/L or less, preferably 0.0001 mol/L or less, more preferably 0.00001 mol/L or less, and particularly preferably 0.000001 mol/L or less) derived from raw materials, manufacturing methods, and the like, may be included in the concept of a polishing composition substantially containing no oxidant.

Examples of other components contained in the polishing composition include, but are not limited to, a chelating agent, an antiseptic agent/antifungal agent, a surfactant other than the aforementioned anionic surfactant, and other known additives (for example, organic acids, organic acid salts, inorganic acids, and inorganic acid salts).

(Chelating Agent)

The polishing composition according to an embodiment of the present invention may contain a chelating agent. The chelating agent captures metal impurities originally contained in the polishing composition, metal impurities generated from a polishing object or a polishing machine or metal impurities introduced from the outside to form a complex, thereby suppressing the residual metal impurities on the polishing object. In particular, when the polishing object is a semiconductor, the residual metal impurities are suppressed, thereby preventing the metal contamination of a semiconductor and suppressing the deterioration of quality of a semiconductor.

Examples of the chelating agent include an aminocarboxylic acid-based chelating agent and an organic phosphonic acid-based chelating agent.

Specific examples of the aminocarboxylic acid-based chelating agent include ethylenediamine tetraacetic acid, sodium ethylenediamine tetraacetate, nitrilotriacetic acid, sodium nitrilotriacetate, ammonium nitrilotriacetate, hydroxyethylethylenediamine triacetic acid, and sodium hydroxyethylethylenediamine triacetate, diethylenetriaminepentaacetic acid, sodium diethylenetriaminepentaacetate, triethylenetetraminehexaacetic acid, and sodium triethylenetetramine hexacetate.

Specific examples of the organic phosphonic acid-based chelating agent include 2-aminoethylphosphonic acid, 1-hydroxyethylidene-1,1-diphosphonic acid, amino tri(methylene phosphonic acid), ethylenediamine tetrakis(methylenephosphonic acid), diethylene triamine penta(methylene phosphonic acid), triethylene tetramine hexa(methylenephosphonic acid), ethane-1,1-diphosphonic acid, ethane-1,1,2-triphosphonic acid, ethane-1-hydroxy-1,1-diphosphonic acid, ethane-1-hydroxy-1,1,2-triphosphonic acid, ethane-1,2-dicarboxy-1,2-diphosphonic acid, methane hydroxyphosphonic acid, 2-phosphonobutane-1,2-dicarboxylic acid, 1-phosphonobutane-2,3,4-tricarboxylic acid, and α-methylphosphonosuccinic acid.

These chelating agents may be used alone, and may also be used as a combination of two or more.

Among the chelating agents, organic phosphonic acid-based chelate is preferable, and ethylenediamine tetrakis (methylenephosphonic acid) is more preferable.

The content of the chelating agent in the polishing composition (total amount in the case where two or more kinds thereof are used) is preferably 0.0001% by mass or more, more preferably 0.0005% by mass or more, and further preferably 0.005% by mass or more. As the content of the chelating agent increases, the effect of suppressing metal impurities remaining on a polishing object is enhanced. Meanwhile, the content of the chelating agent in the polishing composition (total amount in the case where two or more kinds thereof are used) is preferably less than 0.5% by mass, more preferably less than 0.3% by mass, further preferably less than 0.1% by mass, and most preferably less than 0.05% by mass. As the content of the chelating agent decreases, the storage stability of the polishing composition is further maintained.

(Antiseptic Agent/Antifungal Agent)

The polishing composition according to an embodiment of the present invention may further contain an antiseptic agent/antifungal agent.

Examples of the antiseptic agent/antifungal agent include isothiazoline-based antiseptic agents such as 2-methyl-4-isothiazolin-3-one and 5-chloro-2-methyl-4-isothiazolin-3-one, paraoxybenzoic acid esters, and phenoxyethanol.

These antiseptic agent/antifungal agents may be used alone, and may also be used as a combination of two or more.

(Surfactants Other than the Aforementioned Anionic Surfactant)

The polishing composition according to an embodiment of the present invention essentially contains an anionic surfactant having an average addition mole number of oxyalkylene units within a specific range, but may further contain surfactants other than the aforementioned anionic surfactant as long as the effect of the present invention is not impaired. Such surfactants can be added for the purpose of further improving the cleaning efficiency after polishing and preventing the adhesion of dirt and the like.

The surfactant may be any of a cationic surfactant, an amphoteric surfactant, and a nonionic surfactant.

These surfactants may be used alone, and may also be used as a combination of two or more.

The content of the surfactant other than the aforementioned anionic surfactant in the polishing composition (total amount in the case where two or more kinds thereof are used) is not particularly limited, but is preferably $1 \times 10^{-6}$% by mass or more from the viewpoint of further improving cleaning efficiency after polishing. Meanwhile, the upper limit of the content is preferably 1% by mass or less, from the viewpoint of improving a polishing removal rate.

(Other Known Additives)

If necessary, the polishing composition may further contain known additives generally contained in the polishing composition, such as organic acids, organic acid salts, inorganic acids, and inorganic acid salts.

Examples of the organic acids include monocarboxylic acids such as formic acid, acetic acid, and propionic acid; aromatic carboxylic acids such as benzoic acid and phthalic acid; dicarboxylic acids such as oxalic acid, tartaric acid, malic acid, maleic acid, fumaric acid, and succinic acid; polycarboxylic acids such as citric acid and (meth)acrylic acid (also referred to as methacrylic acid); and organic sulfonic acid, and organic phosphonic acid. Examples of the organic acid salts include alkali metal salts such as sodium salts and potassium salts of organic acids, and ammonium salts of organic acids.

Examples of the inorganic acids include sulfuric acid, nitric acid, hydrochloric acid, and carbonic acid. Examples of the inorganic acid salts include alkali metal salts such as sodium salts and potassium salts of inorganic acids, and ammonium salts of inorganic acids.

The organic acids and salts thereof and the inorganic acids and salts thereof may be used alone, and may also be used as a combination of two or more.

[Method for Producing Polishing Composition]

The method of producing a polishing composition according to the present invention is not particularly limited. For example, the polishing composition can be produced by sequentially adding an abrasive, a water-soluble polymer, an anionic surfactant, a basic compound, and other components added as necessary, and stirring the mixture in water.

[Forms and the Like of Polishing Composition]

The polishing composition according to the present invention may be used in a single-agent type or a multi-agent type composed of two or more components. Further, the above-described polishing composition may be used for polishing as it is, or may also be used for polishing after diluting the concentrated solution of the polishing composition by adding water, or, in the case of the multi-agent type polishing composition, after diluting the concentrated solution with an aqueous solution containing water and some of the components. For example, the polishing composition can be prepared by diluting the concentrated solution of the polishing composition at the time of use after storing or transporting the concentrated solution thereof. That is, the concept of a polishing composition in the technique disclosed herein includes both a polishing liquid (working slurry) that is supplied to a polishing object and used for polishing the polishing object, and a concentrated liquid that is diluted and used as a polishing liquid (stock solution of the polishing liquid).

The polishing composition in a concentrated form is advantageous from the viewpoints of convenience in production, distribution, storage and the like, reduction in cost, and the like. The concentration factor can be set to, for example, about 2 times or more and 100 times or less by volume. Generally, it is suitable that the concentration factor is about 5 times or more and 50 times or less by volume. The concentration factor of the polishing composition according to a preferred embodiment is 10 times or more and 40 times or less, for example, 15 times or more and 25 times or less.

The polishing composition according to the present invention is preferably alkaline, and its pH is preferably 8 or more, more preferably 9 or more, and particularly preferably 9.5 or more. As the pH of the polishing composition increases, the polishing removal rate tends to increase. Meanwhile, the pH is preferably 12 or less, more preferably 11 or less, and particularly preferably 10.8 or less. As the pH of the polishing composition decreases, the surface precision tends to improve.

From the above, the pH is preferably in the range of 8 or more and 12 or less, more preferably in the range of 9 or more and 11 or less, and particularly preferably in the range of 9.5 or more and 10.8 or less. Particularly, when the polishing object is a single-crystalline silicon substrate (silicon wafer), the pH of the polishing composition is preferably within the above range.

The polishing composition may be adjusted so that its pH is within the above range, if necessary, when using this polishing composition in recycle. In the adjustment of pH, known pH adjusting agents may be used, and the above-described basic compound may also be used. The pH value of the polishing composition can be confirmed by a pH meter. Detailed measurement methods are described in Examples.

[Polishing Object (Object to be Polished)]

The polishing object to be polished using the polishing composition according to an embodiment of the present invention is not particularly limited, and the polishing composition can be applied to the polishing objects having various materials and shapes. Examples of the material of the polishing object include silicon materials, metals or metalloids such as aluminum, nickel, tungsten, steel, tantalum, titanium, stainless steel, or alloys thereof; glassy materials such as quartz glass, aluminosilicate glass, and glassy carbon; ceramic materials such as alumina, silica, sapphire, silicon nitride, tantalum nitride, and titanium carbide; compound semiconductor substrate materials such as silicon carbide, gallium nitride, and gallium arsenide; and resin materials such as polyimide resins. Further, the polishing object may be made of a plurality of materials among the above materials.

Among these, from the viewpoint that the effect of the polishing composition according to the present invention can be more remarkably obtained, silicon materials are preferable. That is, it is preferable that the polishing composition according to an embodiment of the present invention is used for polishing a silicon material.

Further, it is preferable that the silicon material includes at least one material selected from the group consisting of silicon single crystal, amorphous silicon, and polysilicon. As the silicon material, from the viewpoint that the effect of the present invention can be more remarkably obtained, silicon single crystal or polysilicon is more preferable, and silicon single crystal is particularly preferable. That is, it is preferable that the polishing object is a single-crystal silicon substrate.

Further, the shape of the polishing object is not particularly limited. The polishing composition according to the present invention can be preferably applied to polishing an object having a flat surface such as a plate shape or a polyhedron shape.

[Polishing Method]

As another embodiment of the present invention, there is provided a polishing method which comprises polishing an object by using the above-described polishing composition. Since the polishing composition according to the present invention is excellent in a haze reducing effect, this polishing composition is particularly suitably used in the final polishing step. That is, the polishing method according to the present invention is suitably used in the final polishing step.

Therefore, according to the present invention, there is also provided a method of manufacturing a polished product (for example, a method of manufacturing a silicon wafer) including a final polishing step using the above-described polishing composition. The final polishing step refers to a final polishing step in the manufacturing process of a target object (that is, a step after which further polishing is not performed). The polishing composition according to the present invention may also be used in a polishing step (a step between the rough polishing step and the last polishing step) which is performed before the final polishing step, for example, in a polishing step performed immediately before the final polishing step.

As described above, the polishing composition according to the present invention is particularly preferably used for polishing a single-crystal silicon substrate. Further, it is suitable as a polishing composition to be used in the final polishing step of a single-crystal silicon substrate. More specifically, it is preferable that the polishing composition according to the present invention is applied to a single-crystal silicon substrate prepared to have a surface state with a surface roughness of 0.01 nm or more and 100 nm or less by a step which is performed before the final polishing step.

As a polishing machine, a general polishing machine, which is provided with a holder for holding a substrate or the like having a polishing object and a motor or the like capable of changing the rotational speed and which has a polishing platen capable of attaching to a polishing pad (polishing fabric), can be used.

As the polishing pad, a general nonwoven fabric type, a polyurethane type, a suede type, or the like can be used without particular limitation. It is preferable that the polishing pad is subjected to groove processing so that the polishing composition is accumulated.

Polishing conditions are appropriately set depending on the stage of the polishing step in which the polishing composition is used.

In the stock polishing step, a double-side polishing machine can be suitably used, and the rotational speed thereof is usually about 10 rpm ore more and 100 rpm or less, and preferably about 20 rpm ore more and 50 rpm or less. In this case, although the rotational speeds of the upper rotating platen and the lower rotating platen may be different from each other, they are usually set to the same relative speed with respect to a wafer. In the final polishing step, a single side polishing machine can be suitably used, and the rotational speed thereof is usually about 10 rpm ore more and 100 rpm or less, preferably about 20 rpm ore more and 50 rpm or less, more preferably about 25 rpm ore more and 50 rpm or less. According to such a rotational speed, it is possible to remarkably reduce the haze level of the surface of a polished object.

The polishing object is usually pressed by a platen. In the stock polishing step, the pressure at this time can be appropriately selected, but is usually preferably about 5 kPa or more and 30 kPa or less, and more preferably about 10 kPa or more and 25 kPa or less. Further, in the final polishing step, this pressure is usually preferably about 5 kPa or more and 30 kPa or less, and more preferably about 10 kPa or more and 20 kPa or less. According to such pressure, it is possible to remarkably reduce the haze level of the surface of a polished object.

Although the supply flow rate of the polishing composition can also be appropriately selected according to the size of the platen, considering economic efficiency, in the stock polishing step, the supply flow rate is usually preferably about 0.1 L/min or more and 5 L/min or less, and more preferably about 0.2 L/min or more and 2 L/min or less. In the final polishing step, the supply flow rate is usually preferably about 0.1 L/min or more and 5 L/min or less, and more preferably about 0.2 L/min or more and 2 L/min or less. According to such a supply flow rate, it is possible to efficiently polish the surface of a polishing object and to remarkably reduce the haze level of the surface of the polished object.

Although the holding temperature of the polishing composition in the polishing machine is also not particularly limited, from the viewpoint of stability of polishing removal rate and reduction of haze level, the holding temperature is usually preferably about 15° C. or more and 40° C. or less, and more preferably about 18° C. or more and 25° C. or less.

Regarding the above polishing conditions (setting of a polishing machine), only one example has been described, but the polishing conditions may deviate from the above ranges, and the setting of a polishing machine may be appropriately changed. Such conditions can be appropriately set by those skilled in the art.

Further, it is preferable to perform cleaning and drying after polishing. The method and conditions of these operations are not particularly limited, and known ones are appropriately adopted. For example, it is preferable to perform SC-1 cleaning as a step of cleaning a polished object. The "SC-1 cleaning" is a cleaning method performed using, for example, a mixed solution of ammonia and hydrogen peroxide solution (for example, 40° C. to 80° C.). By performing the SC-1 cleaning, the particles on the surface of a silicon wafer can be removed by thinly etching the surface of the silicon wafer.

EXAMPLES

The present invention will be described in more detail with the following Examples and Comparative Examples. However, the technical scope of the present invention is not limited to the following Examples.

(1) Preparation of Polishing Composition

<Examples 1 to 4 and Comparative Examples 1 to 5>

The polishing compositions of Examples 1 to 4 and Comparative Examples 1 to 5 each having a pH of 10.0 were respectively prepared by mixing the following materials in deionized water so as to have the composition described in Table 1 (mixing temperature: about 20° C., mixing time: about 5 minutes). The pH of each of the polishing compositions (liquid temperature: 20° C.) was measured by a pH meter (product name: LAQUA (registered trademark) manufactured by HORIBA, Ltd.). In this measurement, after 3-point calibration was performed using a standard buffer solution (phthalate pH buffer solution pH: 4.01 (25° C.), neutral phosphate pH buffer solution pH: 6.86 (25° C.), carbonate pH buffer solution pH: 10.01 (25° C.)), a glass electrode was inserted into the polishing composition for 2 minutes or more and stabilized, and then the value of pH of each of the polishing compositions was measured.

Abrasive (colloidal silica, average primary particle diameter: 24 nm, average secondary particle diameter: 46 nm)

Water-soluble polymer (hydroxyethyl cellulose (HEC), weight average molecular weight: 250,000)

Basic compound (ammonia water (29% by mass))

Surfactant

The characteristics of each polishing composition are summarized in Table 1.

<Example 5 and Comparative Examples 6 and 7>

The polishing compositions of Example 5 and Comparative Examples 6 and 7 were respectively prepared in the same manner as in Example 1, except that the kind and amount of the materials added so as to have the composition described in Table 2 were changed. The materials used are as follows.
- Abrasive (colloidal silica, average primary particle diameter: 24 nm, average secondary particle diameter: 46 nm)
- Water-soluble polymer (polyvinyl alcohol-polyvinylpyrrolidone random copolymer (PVA-PVP; PVA:PVP (molar ratio)=90:10), weight average molecular weight: 15,000)
- Basic compound (ammonia water (29% by mass))
- Surfactant The characteristics of each polishing composition are summarized in Table 2.

Example 6 and Comparative Example 8

The polishing compositions of Example 6 and Comparative Example 8 were respectively prepared in the same manner as in Example 1, except that the kind and amount of the materials added so as to have the composition described in Table 3 were changed. The materials used are as follows.
- Abrasive (colloidal silica, average primary particle diameter: 24 nm, average secondary particle diameter: 46 nm)
- Water-soluble polymer (hydroxyethyl cellulose (HEC), weight average molecular weight: 250,000)
- Water-soluble polymer (polyvinylpyrrolidone (PVP), weight average molecular weight: 50,000)
- Basic compound (ammonia water (29% by mass))
- Surfactant The characteristics of each polishing composition are summarized in Table 3.

<Example 7 and Comparative Example 9>

The polishing compositions of Example 7 and Comparative Example 9 were respectively prepared in the same manner as in Example 1, except that the kind and amount of the materials added so as to have the composition in described Table 4 were changed. The materials used are as follows.
- Abrasive (colloidal silica, average primary particle diameter: 24 nm, average secondary particle diameter: 46 nm)
- Water-soluble polymer (random copolymer (hydrophobically modified PVA) having vinyl alcohol unit and n-propyl vinyl ether unit at a ratio (molar ratio) of 85:15), weight average molecular weight: 16,000)
- Basic compound (ammonia water (29% by mass))
- Surfactant The characteristics of each polishing composition are summarized in Table 4.

The weight average molecular weight of the water-soluble polymer was measured by GPC (gel permeation chromatography) under the following measurement conditions.

<GPC Measurement Conditions>
Column: TSKgel GMPWxl×2+G 2500 PWxl (φ7.8 mm×300 mm×3) (manufactured by Tosoh Corporation)
Eluent: 200 mM aqueous sodium nitrate solution
Sample concentration: 0.05% by mass
Flow rate: 1.0 mL/min
Injection amount: 200 μL
Standard material: polyethylene oxide
Column temperature: 40° C.
Detector: differential refractometer (RI).

Further, the average EO addition mole number of the surfactant was measured by GPC under the following measurement conditions.

<GPC Measurement Conditions>
Column: TSKgel G2500PWX (manufactured by Tosoh Corporation)
Eluent: Water/methanol=70/30 (0.5% sodium acetate)
Sample concentration: 0.25% by mass
Flow rate: 1.0 mL/min
Injection amount: 200 μL
Standard material: polyethylene oxide
Column temperature: 40° C.
Detector: differential refractometer (RI).

The average primary particle diameter of the abrasive is a value measured using a surface area measuring apparatus (trade name: Flow Sorb II 2300, manufactured by Micromeritics Instrument Corporation). Further, the average secondary particle diameter of the abrasives is a value measured using a dynamic light scattering type particle size analyzer (trade name: NANOTRACK (registered trademark) UPA-UT 151 manufactured by NIKKISO CO., LTD. (hereinafter, the same).

(2) Evaluation

<Evaluation of Haze (Relative Value)>
<<Pretreatment>>
A single-crystalline silicon substrate (diameter: 300 mm, p type, crystal orientation <100>, resistivity: 0.1 Ω·cm or more and less than 100 Ω·cm, COP free) was pretreated under the following polishing condition (condition I), using a slurry (dispersing medium: water) containing 1% by mass of abrasive (colloidal silica, primary particle diameter: 35 nm, secondary particle diameter: 70 nm) and 0.07% by mass of potassium hydroxide (KOH).

(Condition I)
Polishing machine: single-wafer polishing machine PNX-322 (manufactured by Okamoto Machine Tool works, Ltd.)
Polishing pad: POLYPAS (registered trademark) FP 55 (nonwoven fabric type, thickness of about 2 mm, density of about 0.3 g/cm$^3$, compressive modulus of about 7%, compressive elastic modulus of about 90%, hardness of about 50°, manufactured by Fujibo Ehime Co., Ltd.)
Polishing pressure: 15 kPa
Platen (table) rotational speed: 30 rpm
Head (carrier) rotational speed: 30 rpm
Supply flow rate of polishing composition: 0.5 L/min
Polishing time: 3 min
Temperature of platen cooling water: 20° C.
Holding temperature of polishing composition: 20° C.
<<Polishing>>
Next, the pretreated single-crystalline silicon substrate was polished using each of the polishing compositions obtained in (1) above under the following polishing condition (condition II).

(Condition II)
Polishing machine: single-wafer polishing machine PNX-322 (manufactured by Okamoto Machine Tool works, Ltd.)
Polishing pad: POLYPAS (registered trademark) 27 NX (suede type, thickness of about 1.5 mm, density of about 0.4 g/cm³, compressive modulus of about 20%, compressive elastic modulus of about 90%, hardness of about 40°, average pore size of about 45 μm, porosity of about 25%, manufactured by Fujibo Ehime Co., Ltd.)

Polishing pressure: 15 kPa
Platen (table) rotational speed: 30 rpm
Head (carrier) rotational speed: 30 rpm
Supply flow rate of polishing composition: 0.4 L/min
Polishing time: 4 min
Temperature of platen cooling water: 20° C.
Holding temperature of polishing composition: 20° C.

<<Cleaning and Drying>>

The polished single-crystalline silicon substrate was further cleaned with a solution (NH$_4$OH (29% by mass):H$_2$O$_2$ (31% by mass):deionized water (DIW)=1:1:15 (volume ratio)) (SC-1 cleaning). More specifically, two cleaning baths were prepared, and the above cleaning solution was put into each of the first and second cleaning baths and maintained at 60° C. Then, the polished single-crystalline silicon substrate was immersed in the first cleaning bath for 5 minutes, then through a rinsing bath equipped with an ultrasonic oscillator of 950 kHz frequency with ultrapure water, and then immersed in the second cleaning bath for 5 minutes in the state where the ultrasonic oscillator is operated. Thereafter, spin drying was performed.

<<Evaluation>>

The single-crystalline silicon substrate treated as described above was polished under the above condition II, and then the haze level on the surface of the single-crystalline silicon substrate was measured. In the measurement of the haze level, a haze (ppm) was measured in the DWO mode using a wafer surface defect tester "Surfscan SP2" (manufactured by KLA-Tencor Corporation). The obtained results were converted to relative values where the haze value of Comparative Example 5 was set to 100% and the relative values are shown in Table 1 for Examples 1 to 4 and Comparative Examples 1 to 4. Further, the results were converted to relative values where the haze value of Comparative Example 7 was set to 100% for Example 5 and Comparative Example 6, to relative values where the haze value of Comparative Example 8 was set to 100% for Example 6, and to relative values where the haze value of Comparative Example 9 was set to 100% for Example 7, and the relative values are shown in Tables 2, 3, and 4, respectively. When the haze ratio is less than 100%, a haze reduction effect can be confirmed significant.

<Evaluation of Polishing Removal Rate (Relative Value)>

Pretreatment and polishing were carried out in the same manner as in the above <Evaluation of haze (relative value)>, and the masses of the polishing object (single-crystalline silicon substrate) before and after polishing were measured, respectively. Based on these differences, the amount of change in mass of the polishing object before and after polishing was determined, and for Examples 1 to 4 and Comparative Examples 1 to 4, the amount of change in mass was converted to a relative value where the amount of change in mass in Comparative Example 5 was set to 100%, and the relative values are shown in Table 1. Further, the amount of change in mass was converted to a relative value where the amount of change in mass in Comparative Example 7 was set to 100% for Example 5 and Comparative Example 6, to a relative value where the amount of change in mass in Comparative Example 8 was set to 100% for Example 6, and to a relative value where the amount of change in mass in Comparative Example 9 was set to 100% for Example 7, and the relative values are shown in Tables 2, 3 and 4. When the polishing removal rate ratio exceeds 100%, a polishing removal rate improving effect can be confirmed significant.

TABLE 1

| | Silica concentration [% by mass] | Water-soluble polymer | | | Ammonia concentration [% by mass] | Surfactant Name |
| --- | --- | --- | --- | --- | --- | --- |
| | | Kind | Weight average molecular weight | Concentration [% by mass] | | |
| Example 1 | 0.175 | HEC | 250,000 | 0.0085 | 0.005 | Sodium polyoxyethylene lauryl ether acetate |
| Example 2 | 0.175 | HEC | 250,000 | 0.0085 | 0.005 | Ammonium polyoxyethylene lauryl ether sulfate |
| Example 3 | 0.175 | HEC | 250,000 | 0.0085 | 0.005 | Ammonium polyoxyethylene lauryl ether sulfate |
| Example 4 | 0.175 | HEC | 250,000 | 0.0085 | 0.005 | Polyoxyethylene alkyl (12-15) ether phosphate |
| Comparative Example 1 | 0.175 | — | — | — | 0.005 | Ammonium polyoxyethylene lauryl ether sulfate |
| Comparative Example 2 | 0.175 | HEC | 250,000 | 0.0085 | 0.005 | Triethanolamine lauryl sulfate |
| Comparative Example 3 | 0.175 | HEC | 250,000 | 0.0085 | 0.005 | Ammonium polyoxyethylene lauryl ether sulfate |
| Comparative Example 4 | 0.175 | HEC | 250,000 | 0.0085 | 0.005 | Disodium polyoxyethylene lauryl sulfosuccinate |
| Comparative Example 5 | 0.175 | HEC | 250,000 | 0.0085 | 0.005 | Polyoxyethylene decyl ether |

TABLE 1-continued

|  | Surfactant | | | DWO haze ratio [%] | Polishing removal rate ratio [%] |
|---|---|---|---|---|---|
|  | Kind of anionic surfactant | EO average addition mole number | Concentration [% by mass] | | |
| Example 1 | Carboxylic acid salt (acetate) | 4.5 | 0.0005 | 73 | 133 |
| Example 2 | Sulfuric ester salt | 5 | 0.0005 | 94 | 151 |
| Example 3 | Sulfuric ester salt | 18 | 0.0001 | 84 | 198 |
| Example 4 | Phosphoric ester salt | 6 | 0.0001 | 83 | 245 |
| Comparative Example 1 | Sulfuric ester salt | 5 | 0.0005 | overload | 76 |
| Comparative Example 2 | Sulfuric ester salt | 0 | 0.0005 | 123 | 308 |
| Comparative Example 3 | Sulfuric ester salt | 2 | 0.0005 | 105 | 167 |
| Comparative Example 4 | Sulfonic acid salt/acetate | 3 | 0.0005 | 116 | 89 |
| Comparative Example 5 | — | 5 | 0.0001 | 100 | 100 |

TABLE 2

|  | Silica concentration [wt %] | Water-soluble polymer | | | Ammonia concentration [% by mass] | Surfactant Name |
|---|---|---|---|---|---|---|
|  | | Kind | Weight average molecular weight | Concentration [% by mass] | | |
| Example 5 | 0.085 | PVA-PVP | 15,000 | 0.0045 | 0.005 | Ammonium polyoxyethylene lauryl ether sulfate |
| Comparative Example 6 | 0.085 | PVA-PVP | 15,000 | 0.0045 | 0.005 | Polyoxyethylene decyl ether |
| Comparative Example 7 | 0.085 | PVA-PVP | 15,000 | 0.0045 | 0.005 | Polyoxyethylene decyl ether |

|  | Surfactant | | | DWO haze ratio [%] | Polishing removal rate ratio [%] |
|---|---|---|---|---|---|
|  | Kind of anionic surfactant | EO average addition mole number | Concentration [% by mass] | | |
| Example 5 | Sulfuric ester salt | 18 | 0.00005 | 71 | 140 |
| Comparative Example 6 | — | 5 | 0.00005 | 129 | 180 |
| Comparative Example 7 | — | 5 | 0.00035 | 100 | 100 |

TABLE 3

|  | Silica concentration [wt %] | Water-soluble polymer | | | Ammonia concentration [% by mass] | Surfactant Name |
|---|---|---|---|---|---|---|
|  | | Kind | Weight average molecular weight | Concentration [% by mass] | | |
| Example 6 | 0.175 | HEC | 250,000 | 0.0045 | 0.005 | Ammonium polyoxyethylene lauryl ether sulfate |
|  |  | PVP | 50,000 | 0.003 |  |  |

TABLE 3-continued

| | | | | | | |
|---|---|---|---|---|---|---|
| Comparative Example 8 | 0.175 | HEC | 250,000 | 0.0045 | 0.005 | Polyoxyethylene decyl ether |
| | | PVP | 50,000 | 0.003 | | |

| | | Surfactant | | | | |
|---|---|---|---|---|---|---|
| | Name | Kind of anionic surfactant | EO average addition mole number | Concentration [% by mass] | DWO haze ratio [%] | Polishing removal rate ratio [%] |
| Example 6 | | Sulfuric ester salt | 18 | 0.0001 | 97 | 125 |
| Comparative Example 8 | | — | 5 | 0.00015 | 100 | 100 |

TABLE 4

| | Silica concentration [wt %] | Water-soluble polymer | | | Surfactant Ammonia concentration [% by mass] |
|---|---|---|---|---|---|
| | | Kind | Weight average molecular weight | Concentration [% by mass] | |
| Example 7 | 0.169 | Hydrophobically modified PVA (※1) | 16,000 | 0.0025 | 0.005 |
| Comparative Example 9 | 0.169 | Hydrophobically modified PVA (※1) | 16,000 | 0.0025 | 0.005 |

| | Surfactant | | | | | |
|---|---|---|---|---|---|---|
| | Name | Kind of anionic surfactant | EO average addition mole number | Concentration [% by mass] | DWO haze ratio [%] | Polishing removal rate ratio [%] |
| Example 7 | Ammonium polyoxyethylene lauryl ether sulfate | Sulfuric ester salt | 18 | 0.0002 | 92 | 110 |
| Comparative Example 9 | Polyoxyethylene decyl ether | | 5 | 0.0003 | 100 | 100 |

(※1): random copolymer having vinyl alcohol unit and n-propyl vinyl ether unit at a ratio (molar ratio) of 85:15

From the above results, it was confirmed that the polishing composition according to the present invention can reduce the haze as well as increase the polishing removal rate as compared with the polishing compositions of Comparative Examples. It was found that, the polishing compositions of Comparative Examples 2 to 4 do not have an oxyalkylene unit or contains an anionic surfactant having an average addition mole number of 3 or less, these polishing compositions have a low haze reducing effect. Further, although the anionic surfactant satisfies the requirements of the present invention, the polishing composition of Comparative Example 1 containing no water-soluble polymer has a very low haze reducing effect. The surfactants used in Comparative Examples 5 to 9 correspond to those having substantially the same chemical structure of the nonionic moiety of the anionic surfactant used in Example 2, but the polishing removal rate and the haze reducing effect was deteriorated.

The present application is based on the Japanese patent application No. 2016-38199, filed on Feb. 29, 2016, and Japanese patent application No. 2016-193688, filed on Sep. 30, 2016, and disclosed contents thereof are incorporated herein as a whole by reference.

The invention claimed is:

1. A polishing composition, comprising:
an abrasive;
a water-soluble polymer;
an anionic surfactant;
a basic compound; and
water,
wherein the polishing composition does not substantially contain an oxidant;
wherein the water-soluble polymer is a nonionic water-soluble polymer;
wherein a content of the water-soluble polymer in the polishing composition is $1 \times 10^{-4}$% by mass or more and 0.02% by mass or less;
wherein the anionic surfactant is a sulfuric ester or a salt thereof;
wherein the anionic surfactant has an oxyalkylene unit;
wherein the weight average molecular weight of the anionic surfactant is 200 or more and 5000 or less;
wherein an average addition mole number of the oxyalkylene unit of the anionic surfactant is 5 or more and 18 or less; and
wherein the content of the anionic surfactant in the polishing composition is less than 0.0001% by mass.

2. The polishing composition according to claim 1, wherein a content of the anionic surfactant is $1\times10^{-6}$% by mass or more and less than 0.0001% by mass.

3. The polishing composition according to claim 1, wherein
the water-soluble polymer contains at least one selected from the group consisting of a polymer having a nitrogen atom, a cellulose derivative, and a polymer having a constituent unit derived from vinyl alcohol.

4. The polishing composition according to claim 1, wherein a polishing object is a single-crystalline silicon substrate.

5. A method of polishing an object, comprising:
using the polishing composition according to claim 1.

6. The polishing composition according to claim 3, wherein the water-soluble polymer is a copolymer having a vinyl alcohol unit and a non-vinyl alcohol unit in a molecule.

7. The polishing composition according to claim 3, wherein the water-soluble polymer is a cellulose derivative and the weight average molecular weight of the water-soluble polymer is 250,000 or more.

8. The polishing composition according to claim 1, wherein:
a structure of an ω-position terminal hydrophobic group in the anionic surfactant is substituted with a substituted or unsubstituted C2 to C30 alkyl group; and
the water-soluble polymer contains at least one selected from the group consisting of a polymer having a nitrogen atom, a cellulose derivative, and a polymer having a constituent unit derived from vinyl alcohol.

9. The polishing composition according to claim 8, wherein the anionic surfactant contains at least one selected from the group consisting of polyoxyethylene lauryl ether sulfate, polyoxyethylene myristyl ether sulfate, and polyoxyethylene palmityl ether sulfate; and sodium polyoxyethylene lauryl ether sulfate, ammonium polyoxyethylene lauryl ether sulfate, triethanolamine polyoxyethylene lauryl ether sulfate, sodium polyoxyethylene myristyl ether sulfate, ammonium polyoxyethylene myristyl ether sulfate, triethanolamine polyoxyethylene myristyl ether sulfate, sodium polyoxyethylene palmityl ether sulfate, amine polyoxyethylene palmityl ether sulfate, and triethanolamine polyoxyethylene palmityl ether sulfate.

10. A polishing composition, comprising:
an abrasive;
a water-soluble polymer;
an anionic surfactant;
a basic compound; and
water,
wherein the polishing composition does not substantially contain an oxidant;
wherein the water-soluble polymer is a nonionic water-soluble polymer;
wherein a content of water-soluble polymer in the polishing composition is $1\times10^{-4}$% by mass or more and 0.02% by mass or less;
wherein the anionic surfactant is a carboxylic acid or a salt thereof;
wherein a structure of an ω-position terminal hydrophobic group in the anionic surfactant is substituted with a substituted or unsubstituted C2 to C30 alkyl group;
wherein the anionic surfactant has an oxyalkylene unit;
wherein a weight average molecular weight of the anionic surfactant is 200 or more and 5000 or less;
wherein an average addition mole number of the oxyalkylene unit of the anionic surfactant is more than 3 and 25 or less; and
wherein the content of the anionic surfactant in the polishing composition is less than 0.0001% by mass.

11. The polishing composition according to claim 10, wherein a content of the anionic surfactant is $1\times10^{-6}$% by mass or more and less than 0.0001% by mass.

12. The polishing composition according to claim 10, wherein
the water-soluble polymer contains at least one selected from the group consisting of a polymer having a nitrogen atom, a cellulose derivative, and a polymer having a constituent unit derived from vinyl alcohol.

13. The polishing composition according to claim 12, wherein the anionic surfactant contains at least one selected from the group consisting of polyoxyethylene lauryl ether acetic acid, polyoxyethylene tridecyl ether acetic acid, and polyoxyethylene octyl ether acetic acid; and sodium polyoxyethylene lauryl ether acetate, ammonium polyoxyethylene lauryl ether acetate, sodium polyoxyethylene tridecyl ether acetate, ammonium polyoxyethylene tridecyl ether acetate, sodium polyoxyethylene octyl ether acetate, and ammonium polyoxyethylene octyl ether acetate.

14. A polishing composition, comprising:
an abrasive;
a water-soluble polymer;
an anionic surfactant;
a basic compound; and
water,
wherein the polishing composition does not substantially contain an oxidant;
wherein the water-soluble polymer is a nonionic water-soluble polymer;
wherein a content of water-soluble polymer in the polishing composition is $1\times10^{-4}$% by mass or more and 0.02% by mass or less;
wherein the anionic surfactant is a phosphoric ester or a salt thereof, represented by one or more of the following formulas:

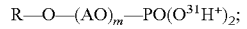

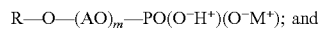

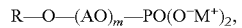

wherein R represents an alkyl group;
wherein AO represents an organic group containing an oxyalkylene unit;
wherein m represents an average addition mole number;
wherein $M^{30}$ represents a cation;
wherein a weight average molecular weight of the anionic surfactant is 200 or more and 5000 or less;
wherein the average addition mole number of the oxyalkylene unit of the anionic surfactant is more than 3 and 25 or less; and
wherein the content of the anionic surfactant in the polishing composition is less than 0.0001% by mass.

15. The polishing composition according to claim 14, wherein a content of the anionic surfactant is $1\times10^{-6}$% by mass or more and less than 0.0001% by mass.

16. The polishing composition according to claim 14, wherein
the water-soluble polymer contains at least one selected from the group consisting of a polymer having a nitrogen atom, a cellulose derivative, and a polymer having a constituent unit derived from vinyl alcohol.

17. The polishing composition according to claim 14, wherein:

the structure of an ω-position terminal hydrophobic group in the anionic surfactant is substituted with a substituted or unsubstituted C2 to C30 alkyl group; and the water-soluble polymer contains at least one selected from the group consisting of a polymer having a nitrogen atom, a cellulose derivative, and a polymer having a constituent unit derived from vinyl alcohol.

18. The polishing composition according to claim 17, wherein the anionic surfactant contains at least one selected from the group consisting of polyoxyethylene lauryl ether phosphate and polyoxyethylene alkyl (12-15) ether phosphate; sodium polyoxyethylene lauryl ether phosphate, sodium polyoxyethylene oleyl ether phosphate, sodium polyoxyethylene palmityl ether phosphate, and potassium polyoxyethylene alkyl (12-15) ether phosphate.

* * * * *